(12) United States Patent
Tews

(10) Patent No.: US 7,462,901 B2
(45) Date of Patent: Dec. 9, 2008

(54) FIELD EFFECT TRANSISTOR

(75) Inventor: Helmut Tews, München (DE)

(73) Assignee: Infineon Technologies AG, Munich (DE)

( * ) Notice: Subject to any disclaimer, the term of this patent is extended or adjusted under 35 U.S.C. 154(b) by 141 days.

(21) Appl. No.: 11/404,682

(22) Filed: Apr. 14, 2006

(65) Prior Publication Data

US 2006/0240614 A1 Oct. 26, 2006

Related U.S. Application Data

(63) Continuation of application No. PCT/EP2004/052216, filed on Sep. 16, 2004.

(30) Foreign Application Priority Data

Oct. 15, 2003 (DE) .................. 103 48 006

(51) Int. Cl.
*H01L 27/108* (2006.01)
(52) U.S. Cl. ............. 257/302; 257/310; 257/E27.095; 257/E27.096; 438/242; 438/240
(58) Field of Classification Search ......... 257/301–302, 257/E27.095–E27.096
See application file for complete search history.

(56) References Cited

U.S. PATENT DOCUMENTS 5,561,308 A   10/1996   Kamata et al.
5,736,435 A   4/1998   Venkatesan et al.
6,391,705 B1   5/2002   Hsiao et al.
7,052,942 B1*   5/2006   Smart et al. .................. 438/162
7,196,382 B2*   3/2007   Kruger et al. ................ 257/382
2003/0057491 A1   3/2003   Mitani et al.
2004/0173839 A1*   9/2004   Casarotto et al. ............. 257/315

FOREIGN PATENT DOCUMENTS

DE   103 01 939 A1   9/2004

OTHER PUBLICATIONS

Can Praseodymium Oxide be an Alternative High-κ Gate Dielectric Material for Silicon Integrated Circuit? H.J. Mussig, H.J. Osten, E. Bugiel, J. Dabrowski, A. Fissel, T. Guminskaya, K. Ignatovich, J.P. Liu, P. Zaumseil, V. Zavodinsky, 2001 IRW Final Report, pp. 1-10.

* cited by examiner

*Primary Examiner*—Jerome Jackson
*Assistant Examiner*—Paul A Budd
(74) *Attorney, Agent, or Firm*—Brinks Hofer Gilson & Lione

(57) ABSTRACT

A field effect transistor is provided. The field effect transistor includes a channel region, electrically conductive channel connection regions, and a control region. The electrically conductive channel connection regions adjoin the channel region along with a transistor dielectric. The control region is separated from the channel region by the transistor dielectric. In addition, the control region may comprise a monocrystalline material.

15 Claims, 2 Drawing Sheets

FIELD EFFECT TRANSISTOR

PRIORITY CLAIM

This application is a continuation of international application PCT/EP2004/052216 filed Sep. 16, 2004, which claims priority to German Patent Application No. DE 10348006.4 Filed Oct. 15, 2003, both of which are incorporated in their entirety by reference herein.

BACKGROUND

1. Field of the Invention

The invention relates to a field effect transistor.

2. Description of Related Art

A field effect transistor may commonly include a channel region, an electrically conductive region, and a control region. The electrically conductive regions adjoin the channel and the control region is separated from the channel region by a transistor dielectric that adjoins the channel region.

The channel region is usually formed of a semiconductor material, for example a material whose resistivity lies between the resistivity of metals and the resistivity of insulators. Accordingly, the semiconductor material may have resistivity values of between approximately $10^{-4}$ and $10^{+12}$ Ωcm. Moreover, the channel region may commonly be formed of a monocrystalline material to provide good switching properties, such as low leakage currents when the transistor is in the off state.

The channel connection regions are commonly referred to as a source and a drain, respectively, and provide a connection to the channel region with the lowest possible resistance. The channel connection regions may contain highly doped semiconductor material and the resistivity of the semiconductor material is reduced by orders of magnitude due to the doping.

The transistor dielectric may be formed from insulating materials, such as silicon dioxide or materials having dielectric constant is considerably greater than the dielectric constant of silicon dioxide. The control region may be referred to as the gate. The control region may commonly be fabricated from a metal or from polycrystalline silicon.

Field effect transistors can be classified into planar field effect transistors and vertical field effect transistors. In the case of planar field effect transistors, the channel region is formed parallel to a substrate surface that may contain the active regions of multiple electronic semiconductor components. In the case of vertical field effect transistors, the channel region is formed transversely and in particular perpendicular to the substrate surface. The current flow in the channel region may be either perpendicular to the substrate surface or parallel to the substrate surface. In the case of a monocrystalline channel region, a control region that is made of a polycrystalline semiconductor material or made of a metal has been considered sufficient since only a control voltage is commonly applied via the control region. Therefore, the current flow with regard to the control region is considered only secondary. This approach leads to restrictions in the design of the integrated circuit arrangement.

These disadvantages become even more evident in the case of field effect transistors for memory cells. Memory units that effect volatile storage and have multiple memory cells include vertical field effect transistors arranged in trenches for connection with capacitors. Problems from the customary approaches arise in regard to leakage associated with the connection regions buried in the trench (buried straps), the production steps for connection regions buried in the trench (buried straps), the space requirement in the arrangement of adjacent transistors, and floating body effects.

Accordingly, there is a need for a field effect transistor that is constructed in a simple manner and is simple to produce. Further, such a field effect transistor may enable the simple production of integrated memory cells and other integrated circuits.

SUMMARY

This invention provides a field effect transistor including a control region. The control region may be fabricated from monocrystalline material. Accordingly, the control region can be readily arranged in a monocrystalline semiconductor substrate. Moreover, it is possible for a control region of monocrystalline material to grow a monocrystalline dielectric epitaxially. In addition, a monocrystalline channel region can also be grown epitaxially on the dielectric. A "monocrystalline" field effect transistor can provide very good electrical properties. In one embodiment, the monocrystalline control region can be arranged in a monocrystalline substrate, which may contain multiple electrical semiconductor components.

In another embodiment, the monocrystalline substrate contains a trench in which the dielectric and the channel region are arranged. The control region may be arranged at a trench wall. In addition, a plurality of field effect transistors may be arranged within the trench. The area requirement for a field effect transistor is particularly small when one channel connection region is arranged closer to the trench bottom than the other channel connection region, as is the case with vertical transistors having a vertical current flow.

In another embodiment, the monocrystalline material containing the control region is a semiconductor material, for example a doped semiconductor material such as silicon or silicon-germanium.

In yet another embodiment, the transistor dielectric may also be formed in monocrystalline fashion. Further, the lattice constant of the monocrystalline transistor dielectric deviates by less than ±5% or by less than ±3% from the lattice constant of the monocrystalline material containing the control region. By virtue of this measure, the transistor dielectric can be applied epitaxially to the monocrystalline material without disturbing crystal structure defects, for example dislocations. Suitable materials for the transistor dielectric in the case of a monocrystalline material made of silicon are for example cerium dioxide ($CeO_2$) or praseodymium oxide, in particular praseodymium trioxide ($Pr_2O_3$).

In yet another embodiment of a field effect transistor, the channel region also comprises monocrystalline material. The channel region can thus be grown epitaxially on a monocrystalline dielectric. The channel region can be doped, however, the channel region may also be undoped, particularly in the case of dimensions in the nanometers range. In one refinement, the channel region has an extent of less than 20 nm transversely with respect to the control region. This measure gives rise to a fully depleted field effect transistor in which short-channel effects do not occur or occur only to a greatly reduced degree. The electrical properties of the field effect transistor are, therefore, particularly good.

The field effect transistor may also be integrated into a memory cell. The abovementioned technical effects also hold true for the memory cell. The memory cell may, for example, be DRAM (Dynamic Random Access Memory) memory cell.

In yet another embodiment, the field effect transistor is arranged at a trench containing a capacitor dielectric and an electrode of a trench capacitor of a memory cell. Further, the capacitor dielectric and one electrode of the trench capacitor are arranged in a lower part of the trench, while the transistor dielectric and the channel region are arranged in an upper part of the trench.

In yet another embodiment, the channel region is arranged along the periphery or a part of the periphery of the upper trench part. The channel region may enclose a dielectric filling material arranged in the interior of the upper trench part. Accordingly, the current depth available for the current flow can be limited by the filling material, so that a fully depleted field effect transistor is provided.

In yet another embodiment, the memory cell does not contain an insulation collar, so that the production steps associated therewith can be obviated. However, as an alternative, an insulation collar may be formed to prevent parasitic transistors from arising if no other measures are taken.

In yet another embodiment, one channel connection region, within the trench, is electrically connected to an electrode of the capacitor. Accordingly, the trench does not contain a buried strap. The production steps associated with the "buried strap" are thus obviated. Moreover, the leakage currents associated with the "buried strap" are obviated.

The invention additionally relates to a method for producing a field effect transistor or for producing a memory cell. The above mentioned technical effects thus also hold true for the method. The method is particularly simple when firstly the transistor dielectric is grown epitaxially on a monocrystalline region for the control region and then the channel region is grown epitaxially on the transistor dielectric.

Further objects, features and advantages of this invention will become readily apparent to persons skilled in the art after a review of the following description, with reference to the drawings and claims that are appended to and form a part of this specification.

BRIEF DESCRIPTION OF THE DRAWINGS

Exemplary embodiments of the invention are explained below with reference to the accompanying drawings.

DETAILED DESCRIPTION OF THE PREFERRED EMBODIMENT

Figure 1A:
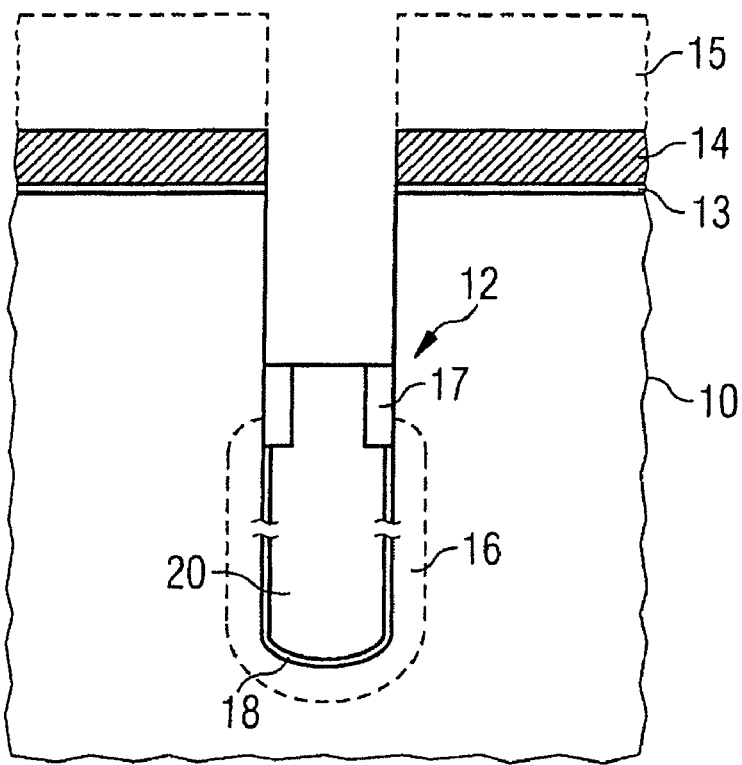
FIGS. 1A to 1D show production stages during the production of a DRAM memory cell.

As illustrated in FIG. 1A, a silicon substrate 10 including a trench 12 is provided. A method for producing a multiplicity of deep trenches is performed in a known manner to provide the trench 12. The trench 12 has, for example, a depth lying between 6 μm and 10 μm. The diameter of the trench is, for example, less than 250 nm (nanometers). The trench 12 is illustrated in greatly shortened fashion in FIGS. 1A to 1D.

In order to produce the trench 12, a thin support layer 13, for example a silicon oxide layer having a thickness of 5 nm, is applied to the substrate 10. The thin support layer 13 has applied to it a thicker support layer 14, for example a silicon nitride layer having a thickness of 100 nm to 200 nm. A hard mask layer 15, for example made of TEOS (tetraethyl orthosilicate) is applied to the support layer 14. The hard mask layer 15 may have a thickness of greater than 500 nm. The hard mask layer 15, the thicker support layer 14, and the thin support layer 13 are patterned with the aid of a photolithographic method. The trench 12 is then etched into the substrate 10 using the hard mask produced from the hard mask layer 15, known etching methods being utilized.

The hard mask layer 15 is subsequently removed. If appropriate, the trench 12 is widened in its lower region, for example in the shape of a bottle (bottle process), before or after the removal of the hard mask layer 15.

An optional surface treatment process may then be applied, during which the roughness of the surface of the trench 12 is increased, for example with the aid of a known HSG (hemispherical growth) method. During the HSG method hemispherical silicon grains are deposited on the trench bottom and on the trench wall of the trench 12.

Afterward, the trench bottom and the sidewalls in the lower part of the trench 12 are doped and a bottom electrode 16 is provided. An insulation collar 17 may then be produced in the upper region of the trench 12 and a capacitor dielectric 18 may be produced on the walls and on the trench bottom of the trench 12.

The trench 12 is then filled with an electrically conductive electrode material 20, for example with highly doped polycrystalline silicon or a metal. After the trench 12 has been filled, planarization is performed with the support layer 14 serving as a stop layer. A suitable planarization method is, for example, a CMP method (Chemical Mechanical Polishing) or an etching method.

As also illustrated in FIG. 1A, the electrode material 20 is etched back after the planarization, for example to 250 nm below the surface of the substrate 10.

The capacitor dielectric 18 and the insulation collar 17 are then removed in the upper part of the trench 12, for example with the aid of a wet-chemical etching method.

In a next method step, the silicon sidewalls in the upper trench region of the trench 12 are prepared for the application of a transistor dielectric, by for example a wet-chemical silicon etching process and a cleaning step. The trench 12 can optionally be widened in its upper region, for example with the aid of an etch that is dependent on crystal direction. With the aid of the direction-oriented etch, it is possible to obtain a square or rectangular trench cross section with crystallographically smooth sidewalls in the upper region of the trench 12, starting from a circular or oval trench cross section.

Figure 1B:
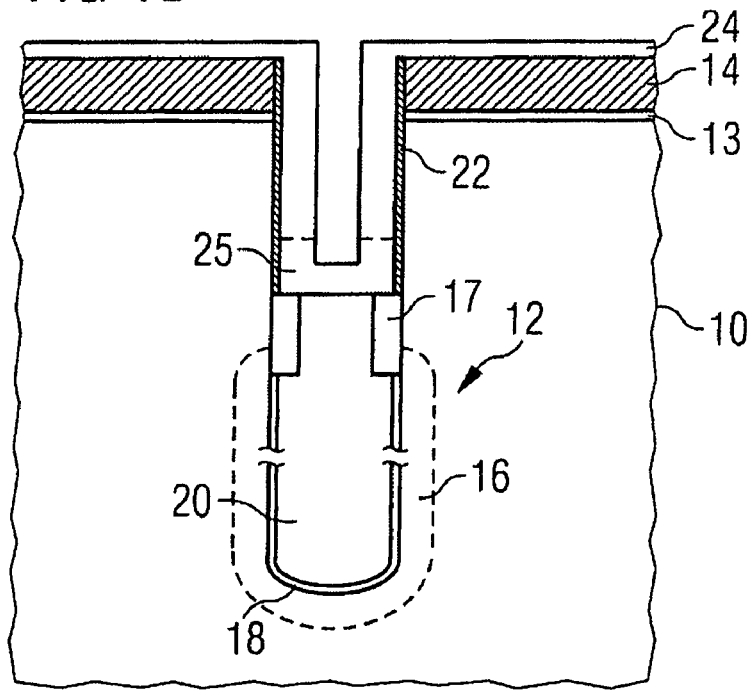

As shown in FIG. 1B, a thin monocrystalline gate dielectric 22 is subsequently produced on the sidewalls of the trench 12 and on the uncovered electrode material 20. The monocrystalline gate dielectric may be produced using an epitaxy method. In one embodiment, the gate dielectric 22 comprises praseodymium trioxide ($Pr_2O_3$). By way of example, an atomic layer deposition (ALD) or other epitaxy method may be used. Other deposition methods may include vapor phase epitaxy, metal organic vapor phase epitaxy or molecular beam epitaxy (MBA).

An optional aftertreatment step may be applied, for example a baking step during which pores in the gate dielectric 22 are closed. A protective layer is then optionally applied to the gate dielectric 22, for example a germanium protective layer, which protects the gate dielectric 22 on the sidewalls of the trench 12 during the subsequent method step.

The gate dielectric 22 is then removed from the electrode material 20, for example with the aid of anisotropic reactive ion etching (RIE). The optionally applied protective layer is then removed, for example using a wet-chemical process.

As illustrated in FIG. 1B, an undoped silicon or silicon-germanium layer 24 is subsequently grown epitaxially on the monocrystalline gate dielectric 22. The silicon layer 24 may have a thickness of between 5 nm and 20 nm (nanometers). The thickness of the silicon layer 24 is chosen such that the channel of the field effect transistor is depleted in order to avoid "floating body" effects. Moreover, a thin silicon layer 24 ensures that minimal lattice defects occur.

An outdiffusion step is then used to produce a drain region 25 at the boundary of silicon layer 24 and electrode material 20. The outdiffusion step dopes the part of the silicon layer 24 within the trench 12 that lies parallel to the bottom of the trench 12. During this step, dopant is outdiffused from the filling material 20 into the silicon layer 24.

Figure 1C:
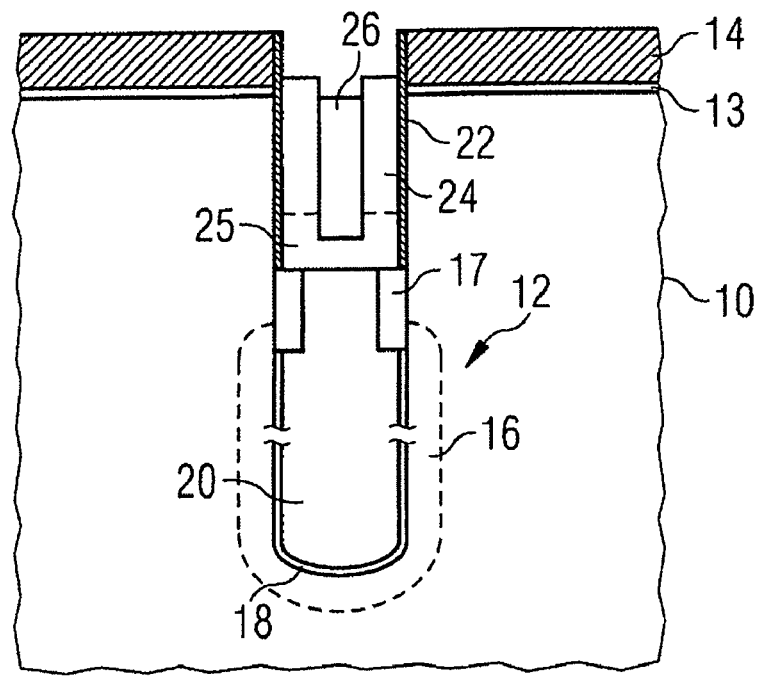

As shown in FIG. 1C, an insulating material 26, such as silicon dioxide or TEOS, is subsequently introduced into the upper part of the trench 12. By way of example, an HDP method (High Density Plasma) may be used for introducing the insulating material 26. The insulating material 26 and the silicon layer 24 are then etched back approximately to the surface of the substrate 10, while the gate dielectric 22 remains on the side areas of the support layer 14.

Figure 1D:
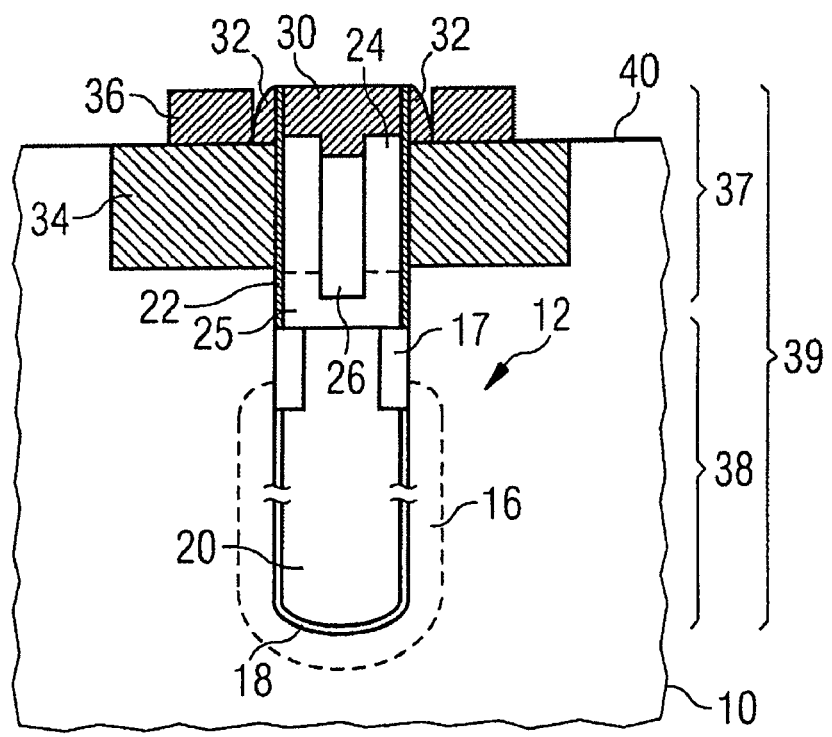

A source contact 30 is then produced. An electrically conductive material is introduced into the uncovered part of the trench 12. For example a highly doped polycrystalline silicon or metal may be used. This process may be carried out in a self-aligning manner. Planarization is then performed, for example using a CMP method, to complete the source contact 30 as shown in FIG. 1D. Support layer 14 and support layer 13 are then removed. In an optional method step, spacer elements 32 are subsequently formed on the sides of the source electrode 30. The spacer elements 32 may be made of silicon dioxide or silicon nitride, for example.

In a next method step, a gate region 34 is implanted using a photolithographic mask. A gate contact 36 may then be produced, for example during the production of word lines of a memory circuit. The gate contact 36 may comprise materials, such as polycrystalline silicon or metal. The gate region 34 is arranged in the monocrystalline substrate 10 and may be heavily n-doped. As such, the field effect transistor 37 is provided along with a trench capacitor 38 as part of a memory cell 39.

In another embodiment, the field effect transistor 37 may be formed in a trench that does not contain a trench capacitor. In another embodiment, the channel connection regions 25, 30 may be arranged within the trench 12 at an equal distance from the surface 40 of the substrate 10. Accordingly, the current flow in the channel can be directed parallel to the surface 40 of the substrate 10.

In yet another embodiment, the gate region 34 is formed within the substrate 10 however, the gate region 34 is formed in a region that is not penetrated by a trench. The transistor dielectric and a silicon layer may accordingly be deposited above the gate region 34. The channel connection regions are subsequently doped with the aid of photolithographic methods.

Other materials, in particular materials having a relative permittivity of greater than 3.9 (silicon dioxide), for example high-K materials, can also be used as transistor dielectric 22. In addition, hafnium dioxide ($HfO_2$) and hafnium silicon oxynitride (HfSiON) may also be used for the transistor dielectric 22.

In yet another embodiment, the insulation collar 17 may be omitted from the trench 12, with the production steps otherwise unchanged.

By virtue of the methods explained, a vertical field effect transistor is provided where the transistor channel is arranged within a trench. Accordingly, the thickness of the channel material may be reduced. In addition, the channel of the vertical transistor is situated within the trench, therefore, the interaction with other closely adjacent transistors is reduced. Further, an insulation collar and/or a horizontally running insulating layer in the trench center or upper region can be obviated. Moreover, the buried strap connection required in the known prior art is omitted, therefore, the capacitance of the trench capacitor can be increased.

As a person skilled in the art will readily appreciate, the above description is meant as an illustration of implementation of the principles this invention. This description is not intended to limit the scope or application of this invention in that the invention is susceptible to modification, variation and change, without departing from the spirit of this invention, as defined in the following claims.

I claim:

1. A field effect transistor comprising:
   a channel region;
   electrically conductive channel connection regions, adjoining the channel region;
   a transistor dielectric adjoining the channel region;
   a gate region separated from the channel region by the transistor dielectric, the gate region being fabricated from monocrystalline material;
   a monocrystalline substrate that contains the gate region and which carries a plurality of electrical semiconductor components; and
   a trench arranged in the monocrystalline substrate wherein the trench contains the transistor dielectric and the channel region, and the gate region being arranged in the monocrystalline substrate at a trench wall of the trench.

2. The field effect transistor as claimed in claim 1, wherein a first channel connection region of the electrically conductive channel connection regions is arranged closer to the trench bottom of the trench than a second channel connection region of the electrically conductive channel connection regions.

3. The field effect transistor as claimed in claim 1, wherein the monocrystalline material contains a doped semiconductor material.

4. The field effect transistor as claimed in claim 3, wherein the doped semiconductor material comprises silicon or silicon-germanium.

5. The field effect transistor as claimed in claim 1, wherein the transistor dielectric is monocrystalline, and a crystal lattice of the transistor dielectric having a lattice constant that deviates by less than 5% from a lattice constant of the monocrystalline material.

6. The field effect transistor as claimed in claim 5, wherein the transistor dielectric comprises praseodymium oxide.

7. The field effect transistor as claimed in claim 5, wherein the transistor dielectric comprises praseodymium trioxide $Pr_2O_3$.

8. The field effect transistor as claimed in claim 1, wherein the channel region comprises monocrystalline material, and the channel region has an extent of less than 20 nm transversely with respect to the gate region.

9. A memory cell comprising a field effect transistor, the field effect transistor comprising:
   a channel region;
   electrically conductive channel connection regions, adjoining the channel region;
   a transistor dielectric adjoining the channel region, the channel region and transistor dielectric being located in a trench;
   a gate region separated from the channel region by the transistor dielectric, the gate region being fabricated from monocrystalline material;
   a monocrystalline substrate which includes the gate region and which carries a plurality of electrical semiconductor components.

10. The memory cell as claimed in claim 9, wherein the field effect transistor is arranged at the trench containing a capacitor dielectric and an electrode of a trench capacitor.

11. The memory cell as claimed in claim 10, wherein the capacitor dielectric and the electrode are arranged in a lower part of the trench, and the transistor dielectric and the channel region are arranged in an upper part of the trench.

12. The memory cell as claimed in claim 11, wherein the channel region is arranged along the periphery or a part of the periphery of the upper part of the trench.

13. The memory cell as claimed in claim 11, wherein the channel region encloses an electrically insulating filling material arranged in the upper part of the trench.

14. The memory cell as claimed in claim 11, further comprising an insulation collar, the insulation collar being arranged between the upper part and the lower part of the trench and being thicker than the capacitor dielectric.

15. The memory cell as claimed in claim 10, wherein a channel connection region of the electrically conductive channel connection regions is located within the trench and is electrically connected to the electrode.

* * * * *

(12) EX PARTE REEXAMINATION CERTIFICATE (7743rd)
United States Patent
Tews

(10) Number: US 7,462,901 C1
(45) Certificate Issued: Sep. 14, 2010

(54) FIELD EFFECT TRANSISTOR

(75) Inventor: Helmut Tews, München (DE)

(73) Assignee: Infineon Technologies AG, Munich (DE)

Reexamination Request:
No. 90/010,602, Jul. 15, 2009

Reexamination Certificate for:
Patent No.: 7,462,901
Issued: Dec. 9, 2008
Appl. No.: 11/404,682
Filed: Apr. 14, 2006

Related U.S. Application Data

(63) Continuation of application No. PCT/EP04/052216, filed on Sep. 16, 2004.

(30) Foreign Application Priority Data

Oct. 15, 2003 (DE) .......................................... 103 48 006

(51) Int. Cl.
*H01L 27/108* (2006.01)

(52) U.S. Cl. ................. 257/302; 257/310; 257/E27.096; 257/E27.095; 257/E21.65; 257/21.652; 257/E21.655; 257/E27.09; 257/E27.091; 257/E21.41; 257/E27.093; 257/E29.154; 257/E29.084; 257/E29.262; 438/240; 438/242

(58) Field of Classification Search .......................... None
See application file for complete search history.

(56) References Cited

U.S. PATENT DOCUMENTS

| | | |
|---|---|---|
| 5,365,097 A | 11/1994 | Kenney |
| 6,424,001 B1 | 7/2002 | Forbes et al. |
| 6,787,433 B2 | 9/2004 | Mitani et al. |
| 7,052,942 B1 | 5/2006 | Smart et al. |
| 7,196,382 B2 | 3/2007 | Krüger et al. |
| 2004/0173839 A1 | 9/2004 | Casarotto et al. |

*Primary Examiner*—Erik Kielin

(57) ABSTRACT

A field effect transistor is provided. The field effect transistor includes a channel region, electrically conductive channel connection regions, and a control region. The electrically conductive channel connection regions adjoin the channel region along with a transistor dielectric. The control region is separated from the channel region by the transistor dielectric. In addition, the control region may comprise a monocrystalline material.

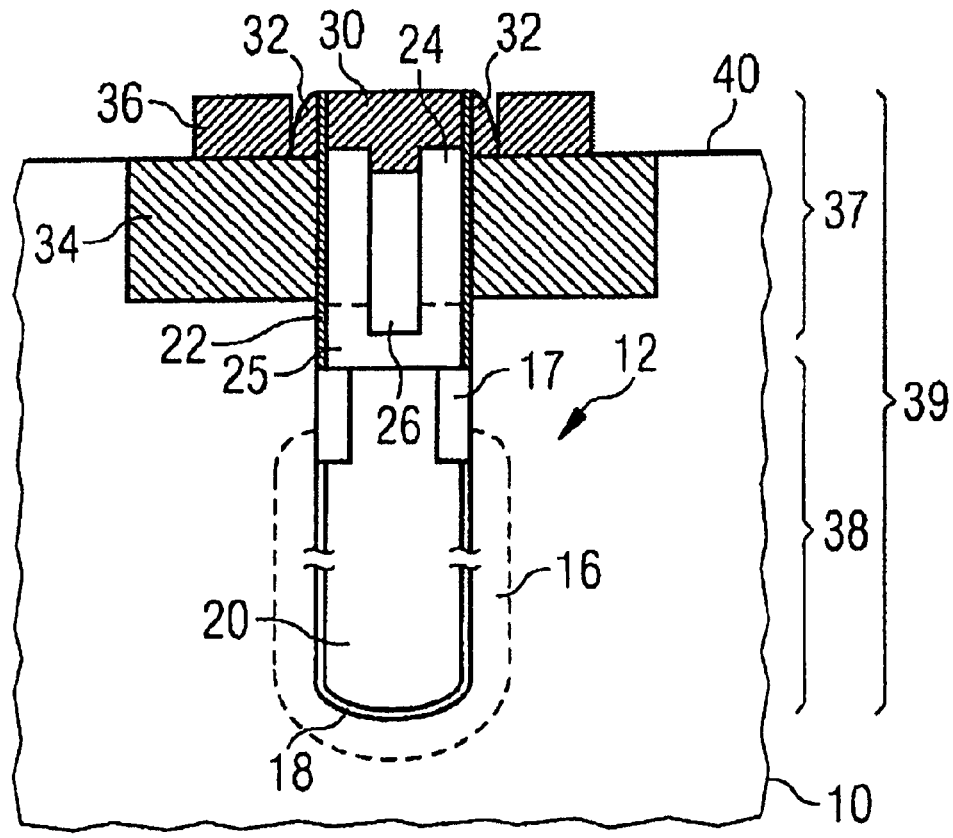

EX PARTE
REEXAMINATION CERTIFICATE
ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 9 are determined to be patented as amended.

Claims 2-8 and 10-15, dependent on an amended claim, are determined to be patentable.

1. A field effect transistor comprising:
a channel region;
electrically conductive channel connection regions, adjoining the channel region;
a transistor dielectric adjoining the channel region;
a gate region separated from the channel region by the transistor dielectric, the gate region being fabricated from monocrystalline material;
a monocrystalline substrate that contains the gate region and which carries a plurality of electrical semiconductor components; and
a trench arranged in the monocrystalline substrate wherein the trench contains the transistor dielectric and the channel region, and the gate region being arranged in the monocrystalline substrate at a trench wall of the trench, *the gate region formed of the monocrystalline material being located within the monocrystalline substrate and outside the trench.*

9. A memory cell comprising a field effect transistor, the field effect transistor comprising:
a channel region;
electrically conductive channel connection regions, adjoining the channel region;
a transistor dielectric adjoining the channel region, the channel region and transistor dielectric being located in a trench;
a gate region separated from the channel region by the transistor dielectric, the gate region being fabricated from monocrystalline material;
a monocyrstalline substrate which includes the gate region and which carries a plurality of electrical semiconductor components, *the gate region formed of the monocrystalline material being located within the monocrystalline substrate and outside the trench.*

\* \* \* \* \*